US011476737B2

(12) United States Patent
Joshi et al.

(10) Patent No.: US 11,476,737 B2
(45) Date of Patent: Oct. 18, 2022

(54) INTEGRATED POWER CONTROL ASSEMBLIES WITH BUILT-IN COOLING SYSTEMS

(71) Applicant: TOYOTA MOTOR ENGINEERING & MANUFACTURING NORTH AMERICA, INC., Plano, TX (US)

(72) Inventors: Shailesh N. Joshi, Ann Arbor, MI (US); Yanghe Liu, Ann Arbor, MI (US); Fa Chen, Lincoln, NE (US)

(73) Assignee: Toyota Motor Engineering & Manufacturing North America. Inc., Plano, TX (US)

( * ) Notice: Subject to any disclaimer, the term of this patent is extended or adjusted under 35 U.S.C. 154(b) by 267 days.

(21) Appl. No.: 16/818,559

(22) Filed: Mar. 13, 2020

(65) Prior Publication Data
US 2021/0288555 A1   Sep. 16, 2021

(51) Int. Cl.
*H05K 7/20* (2006.01)
*H02K 9/22* (2006.01)
(Continued)

(52) U.S. Cl.
CPC .................. *H02K 9/22* (2013.01); *H02K 5/20* (2013.01); *H02K 9/00* (2013.01); *H02K 11/33* (2016.01);
(Continued)

(58) Field of Classification Search
CPC . H02K 9/00; H02K 9/22; H02K 11/33; H02K 5/20; H05K 7/2089; H05K 7/20945
See application file for complete search history.

(56) References Cited

U.S. PATENT DOCUMENTS

| 2002/0076851 A1* | 6/2002 | Eden | H01L 23/50 257/E23.079 |
| 2009/0154101 A1* | 6/2009 | Korich | H02M 7/003 361/689 |

(Continued)

FOREIGN PATENT DOCUMENTS

| CN | 204020542 U | 12/2014 |
| CN | 207588650 U | 7/2018 |

(Continued)

*Primary Examiner* — Stephen S Sul
*Assistant Examiner* — Alexander Ryan Horton
(74) *Attorney, Agent, or Firm* — Dinsmore & Shohl LLP

(57) ABSTRACT

An integrated power control assembly configured as an inverter for a motor is mounted directly on an axial end of the motor. The integrated power control assembly includes one or more power plates, one or more cooling plates coaxially disposed on and thermally connected to the one or more power plates, and one or more circuit boards circumferentially disposed around the one or more power plates. An individual power plate has a power card having one or more switching semiconductor devices corresponding to individual phases of the motor. The individual power card is electrically coupled to the motor through one or more busbars. An individual circuit board is electrically coupled to an individual power card corresponding to an individual phase of the motor. The individual circuit board has a first surface electrically coupled to the one or more power plates and a second surface opposite to the first surface.

20 Claims, 10 Drawing Sheets

(51) Int. Cl.
    *H02K 11/33*     (2016.01)
    *H02K 5/20*     (2006.01)
    *H02K 9/00*     (2006.01)

(52) U.S. Cl.
    CPC ....... *H05K 7/2089* (2013.01); *H05K 7/20945* (2013.01)

(56) References Cited

U.S. PATENT DOCUMENTS

| | | | |
|---|---|---|---|
| 2013/0278090 A1* | 10/2013 | Matsuo | H02K 5/203 310/54 |
| 2017/0338208 A1* | 11/2017 | Letowski | H01L 24/80 |
| 2018/0248442 A1* | 8/2018 | Fröhlich | H02K 11/33 |
| 2019/0071285 A1* | 3/2019 | Kuczera | H02K 7/088 |
| 2019/0165633 A1 | 5/2019 | Gu et al. | |
| 2019/0165653 A1 | 5/2019 | Gu et al. | |
| 2019/0386534 A1* | 12/2019 | Hirosawa | F25B 31/026 |
| 2020/0220439 A1* | 7/2020 | Sigmar | H02K 3/24 |
| 2020/0227794 A1* | 7/2020 | Mazza | H01M 10/6567 |
| 2021/0212200 A1* | 7/2021 | Peters | H01G 2/065 |

FOREIGN PATENT DOCUMENTS

| | | | |
|---|---|---|---|
| JP | 2015171246 A | 9/2015 | |
| JP | 2015213406 A | 11/2015 | |

\* cited by examiner

INTEGRATED POWER CONTROL ASSEMBLIES WITH BUILT-IN COOLING SYSTEMS

TECHNICAL FIELD

The present specification generally relates to power control assemblies for motors in vehicles and, more specifically, to integrated power control assemblies with built-in cooling systems for motors in electric and/or hybrid electric vehicles.

BACKGROUND

Conventional motor drive systems in electric and/or hybrid electric vehicles consist of three parts—the motor, the power control unit (PCU) and the high voltage cables. In this type of system, the motor and its corresponding PCU are designed and installed separately. However, the power density is limited due to the existence of cables and separated enclosures. The interconnecting cables produce extra power loss, weight, and volume, reducing the system efficiency. The cooling systems are designed separately for the motor and PCU, thereby increasing the complexity of the cooling system.

Further, as power control assemblies are designed to operate at increased power levels, they generate high heat flux. This means that the printed circuit board (PCB) and the active and passive components disposed on the PCB in the power control assembly should be able to withstand higher temperatures and thermally induced stresses. Conventional heat sinks may be unable to remove sufficient heat to effectively lower the operating temperature of the power control assemblies to acceptable temperature levels. Further, conventional heat sinks and cooling structures may require additional bonding layers and thermal matching materials (e.g., bond layers, substrates, thermal interface materials). These additional layers and other factors add packaging size and substantial thermal resistance to the overall power control assemblies and make their thermal management challenging.

Accordingly, it may be desirable to have alternate power control assemblies having cooling mechanisms.

SUMMARY

The present specification relates to integrated power control assemblies with built-in cooling systems for motors in electric and/or hybrid electric vehicles. In one embodiment, an integrated power control assembly configured as an inverter for a motor is disclosed. The integrated power control assembly is mounted directly on an axial end of the motor and includes one or more power plates, one or more cooling plates coaxially disposed on and thermally connected to the one or more power plates, and one or more circuit boards circumferentially disposed around the one or more power plates. An individual power plate has a power card having one or more switching semiconductor devices corresponding to individual phases of the motor. The individual power card is electrically coupled to the motor through one or more busbars. An individual circuit board is electrically coupled to an individual power card corresponding to an individual phase of the motor. The individual circuit board has a first surface electrically coupled to the one or more power plates and a second surface opposite to the first surface.

In another embodiment, a motor assembly including a motor and an integrated power control assembly configured as an inverter for the motor, is disclosed. The integrated power control assembly is mounted directly on an axial end of the motor and includes one or more power plates, one or more cooling plates coaxially disposed on and thermally connected to the one or more power plates, and one or more circuit boards circumferentially disposed around the one or more power plates. An individual power plate has a power card having one or more switching semiconductor devices corresponding to individual phases of the motor. The individual power card is electrically coupled to the motor through one or more busbars. An individual circuit board is electrically coupled to an individual power card corresponding to an individual phase of the motor. The individual circuit board has a first surface electrically coupled to the one or more power plates and a second surface opposite to the first surface.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Various embodiments described herein are directed to integrated power control assemblies with built-in cooling systems for motors in electric and/or hybrid electric vehicles. The integrated power control assemblies are configured to function as an inverter for an electric motor and are modular in nature. The integrated power control assemblies are mounted directly on an axial end of the motor and formed from one or more power plates and one or more cooling plates coaxially disposed on and thermally connected to the power plates to form a stackable configuration. The power plates are segmented into power cards having one or more switching semiconductor devices for the motor. Due to the modular nature, the number of power plates and cooling plates can be adjusted to meet any current/power rating requirements. Further, the integrated power control assemblies include one or more circuit boards circumferentially disposed around and electrically coupled to the power plates. The circuit boards include gate drive devices for controlling the switching semiconductor devices in the power cards. The power cards are electrically coupled to the motor using busbars. Finally, since the cooling plates are thermally connected to the power plates to form a stackable configuration, there may not be a need for a separate cooling system for the integrated power control assemblies. As a result, heat generated by the operation of the integrated power control assemblies can be easily removed. Various other aspects of the disclosure and variations thereof are illustrated or implied through the descriptions of the embodiments below.

Figure 1:
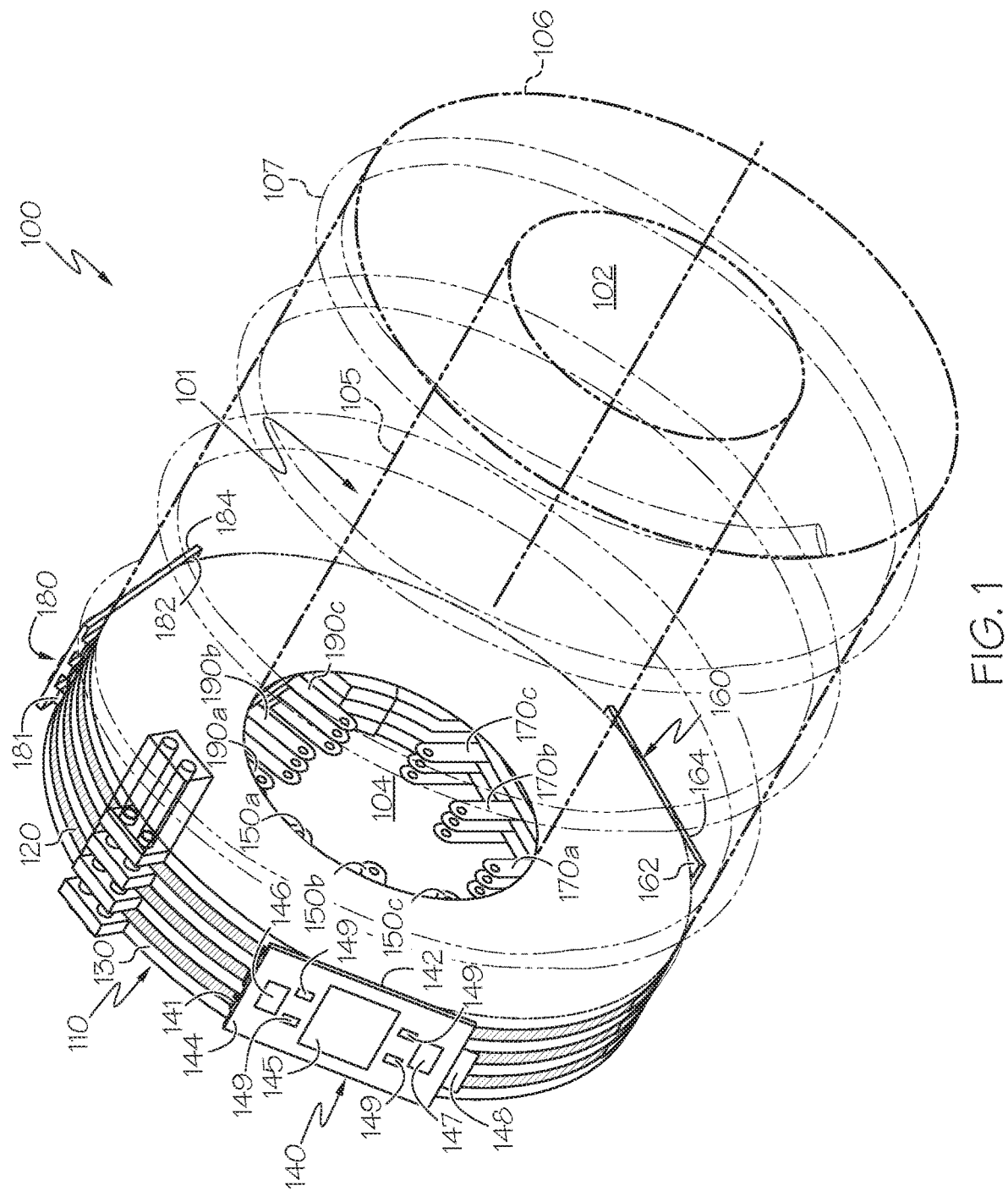
FIG. 1 depicts a perspective view of an example motor assembly with an example motor and an example integrated power control assembly, according to one or more embodiments shown and described herein.
Figure 2:
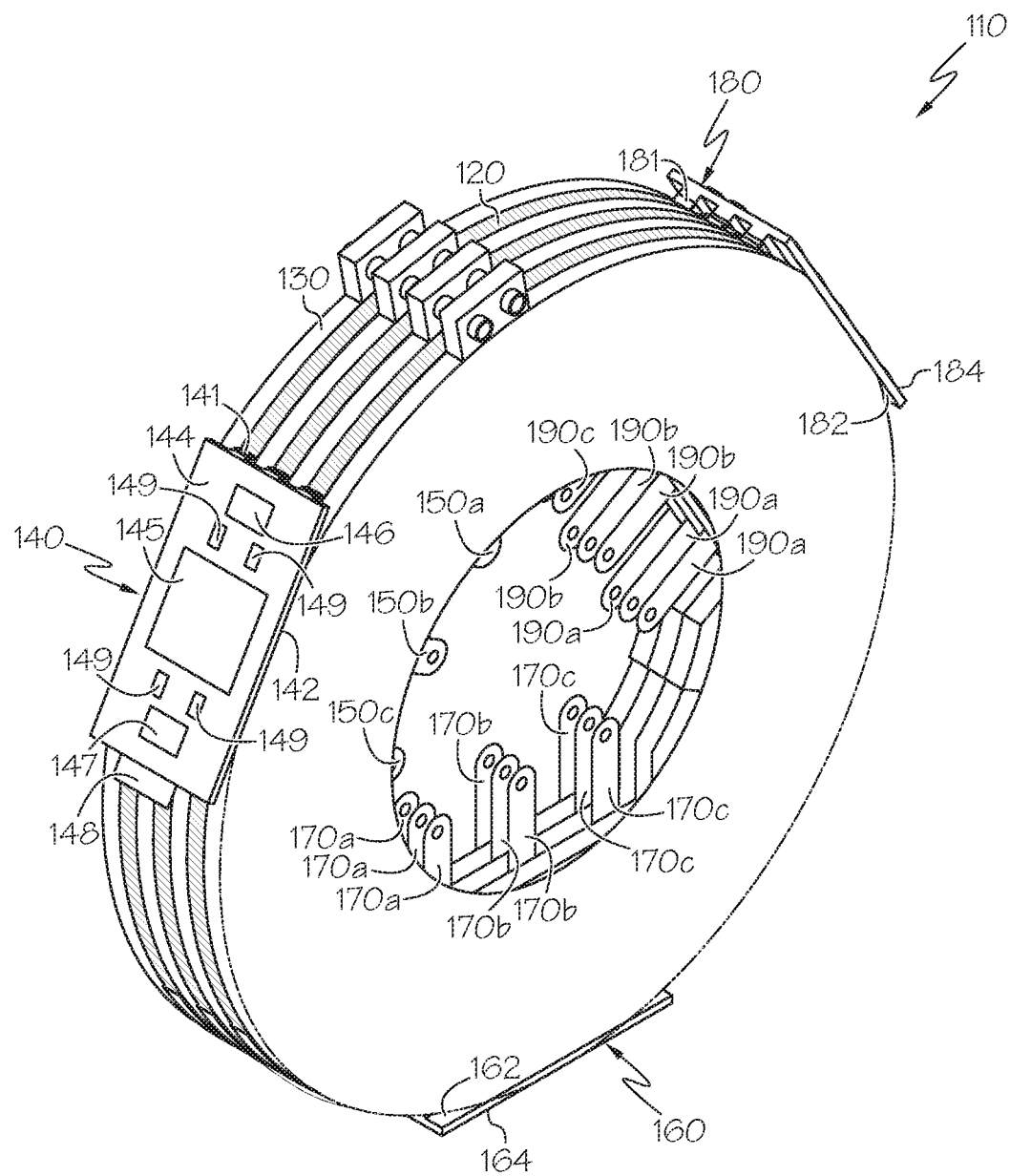
FIG. 2 depicts an assembled perspective view of the example integrated power control assembly of FIG. 1, according to one or more embodiments shown and described herein.
Figure 3:
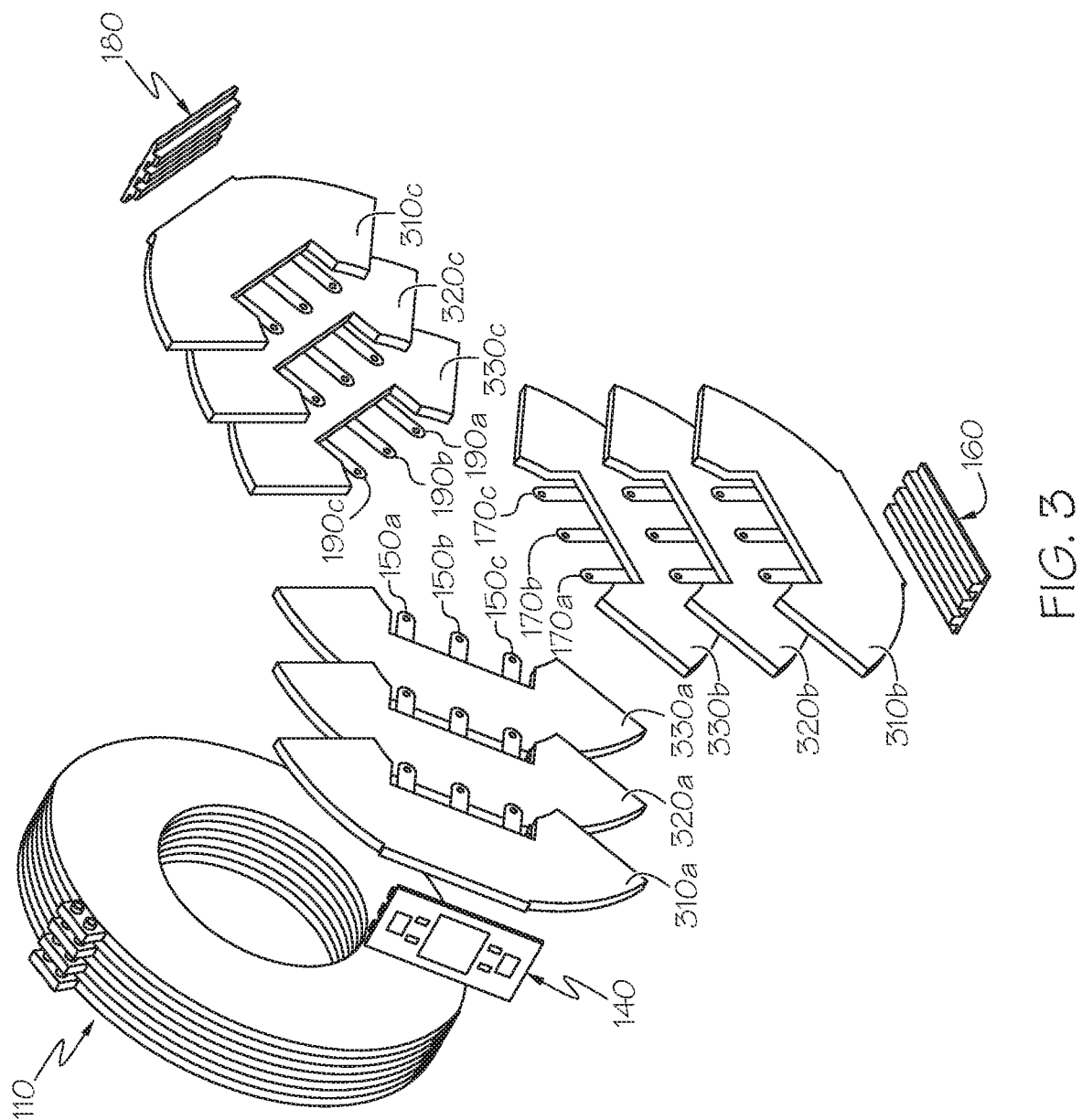
FIG. 3 depicts an exploded perspective view of the example integrated power control assembly of FIG. 1 and a cooling jacket encasing the example motor of FIG. 1, according to one or more embodiments shown and described herein.

Referring to the figures, FIG. 1 depicts a perspective view of an example motor assembly 100 with a motor 101 and an example integrated power control assembly 110, while FIG. 2 and FIG. 3 depict an assembled perspective view and an exploded perspective view respectively of the example integrated power control assembly 110 of FIG. 1. In the embodiment shown in FIG. 1, the motor 101 is a three-phase electric motor. However, in different embodiments, the motor 101 may be an electric motor having more than three phases or two phases. The motor 101 has a first axial end 102, a second axial end 104 and a motor shaft 105 in between the first axial end 102 and the second axial end 104. The first axial end 102 is configured to be connected to a drive shaft and power transmission gear (not shown) of a vehicle 1000 (shown in FIG. 10). The integrated power control assembly 110 is mounted directly to the second axial end 104 of the motor 101. The motor 101 is encased within a cooling jacket 106 (described below and shown in FIG. 6) having a cooling pipe 107 spiraling externally around the cooling jacket 106 between the first axial end 102 and the second axial end 104 of the motor 101.

The example integrated power control assembly 110 is configured as a three-phase (U, V, W) inverter, which converts DC voltage into three sinusoidal AC waves of equal amplitude in three different phases U. V, and W respectively (for example, by using Pulse Width Modulation (PWM)) for the motor 101. In some embodiments, where the motor 101 has more than three phases, the integrated power control assembly 110 is configured to produce additional or alternative AC output(s). The integrated power control assembly 110 may have a stacked configuration of power plates 120 and cooling plates 130 thermally connected to each other. Individual power plates 120 may be formed from an electrically conductive material such as, but not limited to, copper, aluminum, and nickel. In some embodiments, individual cooling plates 130 may be formed from a dielectric material such as ceramic or a polymer material. In other embodiments, the individual cooling plates 130 may be formed from a non-dielectric material so long as an individual power plate 120 is separated from an adjacent individual cooling plate 130 by an electrically insulating layer.

Figure 9:
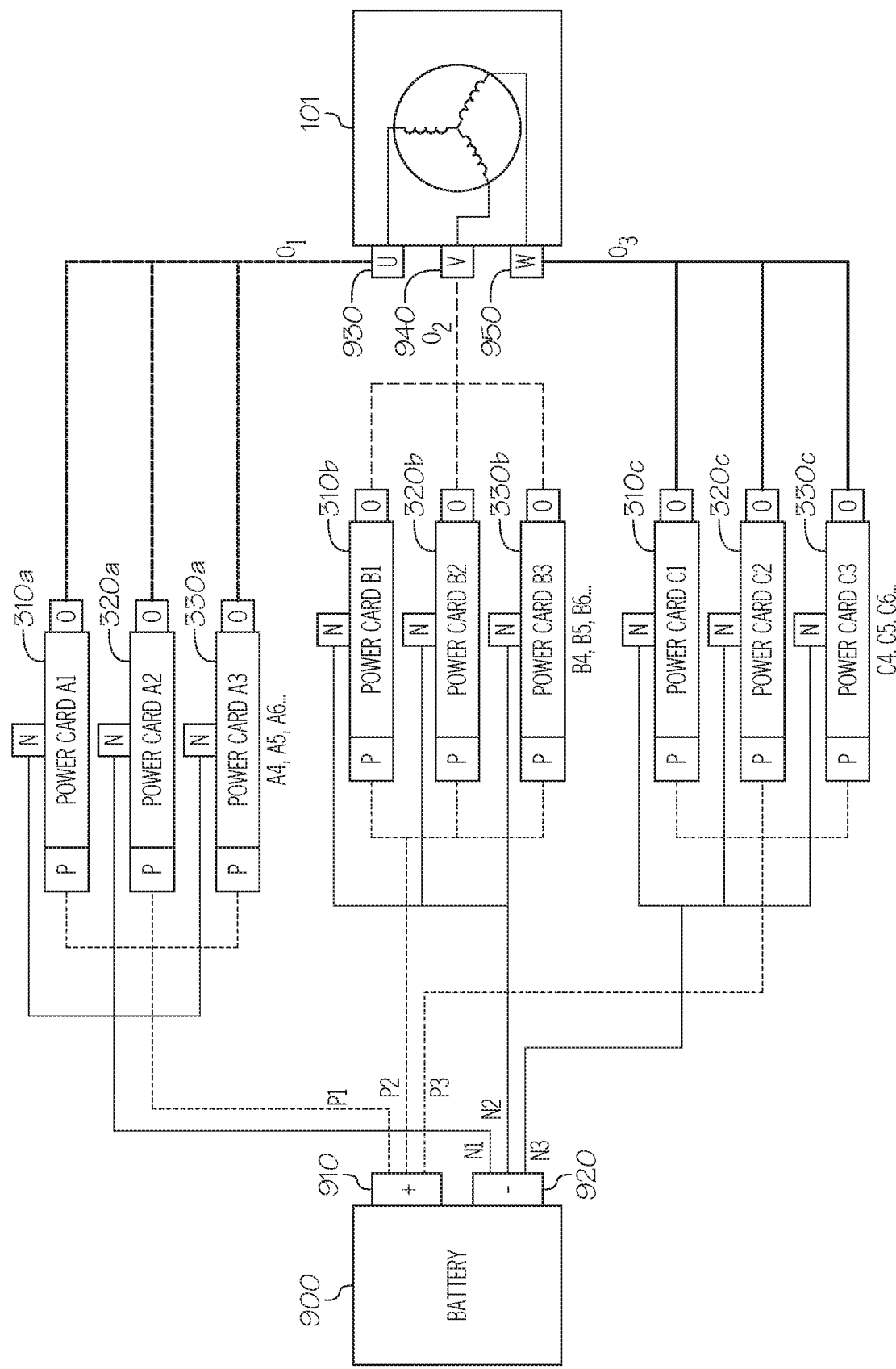
FIG. 9 schematically depicts an arrangement of electrical connections of the example integrated power control assembly with a battery and the example motor of FIG. 1 in an electric vehicle, according to one or more embodiments shown and described herein.

In the embodiment shown in FIGS. 1-3, where the motor 101 is a three-phase electric motor, an individual power plate 120 has power cards 310a, 310b, 310c (for the power plate 310 in FIG. 3) or power cards 320a. 320b, 320c (for the power plate 320 in FIG. 3) or power cards 330a, 330b, 330c (for the power plate 330 in FIG. 3), etc. corresponding to three different phases U, V, and W respectively of the motor 101. In embodiments where the motor 101 is an electric motor having more than three phases, the number of power cards in the individual power plate 120 is equal to the number of the phases of the motor 101. Notably, the number of power plates 120 may be higher or lower than three (as shown in FIG. 9) and depends on the number of power plates 120 needed to meet the current/power rating requirements for operation of the motor 101.

In some non-limiting embodiments as shown in FIGS. 1-3, the power plates 120 and cooling plates 130 may be disposed alternatively to form the stacked configuration. In some non-limiting embodiments as shown in FIGS. 1-3, an individual power plate 120 is disposed between two cooling plates 130 to enable double-sided cooling of the individual power plate 120. However, in other embodiments, the power plates 120 and the cooling plates 130 may not be alternatively disposed and be only thermally connected. Further, in some non-limiting embodiments as shown in FIGS. 1-3, the individual power plate 120 and the individual cooling plate 130 are shaped as circular disks and coaxially disposed over each other. However, in other embodiments, the individual power plate 120 and the individual cooling plate 130 may be differently shaped. In the example embodiment shown in FIGS. 1-3, three power plates 120 are disposed between four cooling plates 130 to form a stacked configuration.

In the example embodiment shown in FIGS. 1-3, where the motor 101 is a three-phase electric motor, the example integrated power control assembly 110 further comprises circuit boards 140, 160, 180 circumferentially mounted around a circumference of the stacked configuration of the power plates 120 and the cooling plates 130. In the embodiment shown in FIGS. 1-3, the circuit boards 140, 160, 180 are symmetrically disposed around the circumference of the stacked configuration of the power plates 120 and the cooling plates 130 at an angle of a hundred and twenty degrees apart from each other, though in different embodiments, the circuit boards 140, 160, 180 may not be so symmetrically disposed. In embodiments where the motor 101 is an electric motor having more than three phases, the number of circuit boards is equal to the number of the phases of the motor 101. In some embodiments, a planar bond layer 141, 161, 181 may be used to electrically couple the circuit boards 140, 160, 180 to the power plates 120. This removes the need to use small wire bonding and results in reducing loop inductance, voltage spikes and switching power loss.

As shown in the example embodiment of FIG. 3, the individual circuit board 140 is electrically coupled to the individual power cards 310a, 320a, 330a corresponding to the phase U of the motor 101. The example individual power cards 310a, 320a, 330a each have a set of three busbars 150a, 150b, 150c (shown in further detail in FIG. 4). The busbars 150a, 150b, 150c may be flexible and oriented in any way (for example, bent by ninety degrees) to make electrical connections. The busbar 150a electrically connects the individual power cards 310a. 320a, 330a via connection P1 to a positive terminal 910 of a battery 900 (shown in FIG. 9). The busbar 150c electrically connects the individual power cards 310a, 320a, 330a via connection N1 to a negative terminal 920 of the battery 900 (shown in FIG. 9). The busbar 150b electrically connects a U-Phase AC output of the individual power cards 310a. 320a, 330a via connection O1 to the motor 101.

Further, the individual circuit board 140 has a first surface 142 electrically coupled to the power plates 120 using the planar bond layer 141. The individual circuit board 140 has a second surface 144 opposite to the first surface 142. One or more decoupling capacitors 145, one or more semiconductor devices 146, and one or more gate drive devices 147 may be disposed on the second surface 144. The decoupling capacitors 145 are configured to electrically connect individual power cards 310a, 320a. 330a corresponding to the phase U of the motor 101. The gate drive device(s) 147 may include one or more active components. The gate drive devices 147 on the individual circuit board are configured to control the operation of the switching semiconductor devices 530a, 530c (as described in FIG. 5 with respect to power card 310a) in individual power cards 310a. 320a. 330a. The gate drive devices 147 may be coupled to one or more passive components 149 such as, but not limited to, capacitor(s), resistor(s), transformer(s) and inductor(s). A signal connector 148 configured to connect with a signal controller (not shown) may also be disposed on the second surface 144 of the circuit board 140.

As shown in the example embodiment of FIG. 3, the individual circuit board 160 is electrically coupled to the individual power cards 310b, 320b. 330b corresponding to the phase V of the motor 101. The example individual power cards 310b, 320b, 330b each have a set of three busbars 170a, 170b, 170c (similar to the busbars 150a, 150b, 150c shown in FIG. 4). The busbar 170a electrically connects the individual power cards 310b, 320b, 330b via connection P2 to the positive terminal 910 of the battery 900 (shown in FIG. 9). The busbar 170c electrically connects the individual power cards 310b, 320b, 330b via connection N2 to the negative terminal 920 of the battery 900 (shown in FIG. 9). The busbar 170b electrically connects a V-Phase AC output of the individual power cards 310b, 320b, 330b via connection O2 to the motor 101.

Further, the individual circuit board 160 has a first surface 162 electrically coupled to the power plates 120 using the planar bond layer 161. The individual circuit board 160 has a second surface 164 opposite to the first surface 162. One or more decoupling capacitors 165, one or more semiconductor devices 166, and one or more gate drive devices 167 may be disposed on the second surface 164. The decoupling capacitors 165 are configured to electrically connect individual power cards 310b, 320b, 330b corresponding to the phase V of the motor 101. The gate drive device(s) 167 may include one or more active components. The gate drive devices 167 on the individual circuit board are configured to control the operation of the switching semiconductor devices (similar to the devices 530a, 530c as described in FIG. 5 with respect to power card 310a) in individual power cards 310b, 320b, 330b. The gate drive devices 167 may be coupled to one or more passive components 169 such as, but not limited to, capacitor(s), resistor(s), transformer(s) and inductor(s). A signal connector 168 configured to connect with a signal controller (not shown) may also be disposed on the second surface 164 of the circuit board 160.

As shown in the example embodiment of FIG. 3, the individual circuit board 180 is electrically coupled to the individual power cards 310c, 320c, 330c corresponding to the phase W of the motor 101. The example individual power cards 310c, 320c, 330c each have a set of three busbars 190a, 190b, 190c (similar to the busbars 150a, 150b, 150c shown in FIG. 4). The busbar 190a electrically connects the individual power cards 310c, 320c, 330c via connection P3 to the positive terminal 910 of the battery 900 (shown in FIG. 9). The busbar 190c electrically connects the individual power cards 310c, 320c, 330c via connection N3 to the negative terminal 920 of the battery 900 (shown in FIG. 9). The busbar 190b electrically connects a W-Phase AC output of the individual power cards 310c, 320c, 330c via connection O3 to the motor 101.

Further, the individual circuit board 180 has a first surface 182 electrically coupled to the power plates 120 using the planar bond layer 181. The individual circuit board 180 has a second surface 184 opposite to the first surface 182. One or more decoupling capacitors 185, one or more semiconductor devices 186, and one or more gate drive devices 187 may be disposed on the second surface 184. The decoupling capacitors 185 are configured to electrically connect individual power cards 310c, 320c, 330c corresponding to the phase W of the motor 101. The gate drive devices 187 on the individual circuit board are configured to control the operation of the switching semiconductor devices (similar to the devices 530a, 530c as described in FIG. 5 with respect to power card 310a) in individual power cards 310c, 320c, 330c. The gate drive devices 187 may be coupled to one or more passive components 189 such as, but not limited to, capacitor(s), resistor(s), transformer(s) and inductor(s). A signal connector 188 configured to connect with a signal controller (not shown) may also be disposed on the second surface 184 of the circuit board 180.

The individual circuit boards 140, 160, 180 and their respective configurations depicted in FIGS. 1-3 are depicted only as examples and in different embodiments, may incorporate additional or alternate configurations that are compatible with the features and operating principles of the integrated power control assembly described herein.

Figure 4:
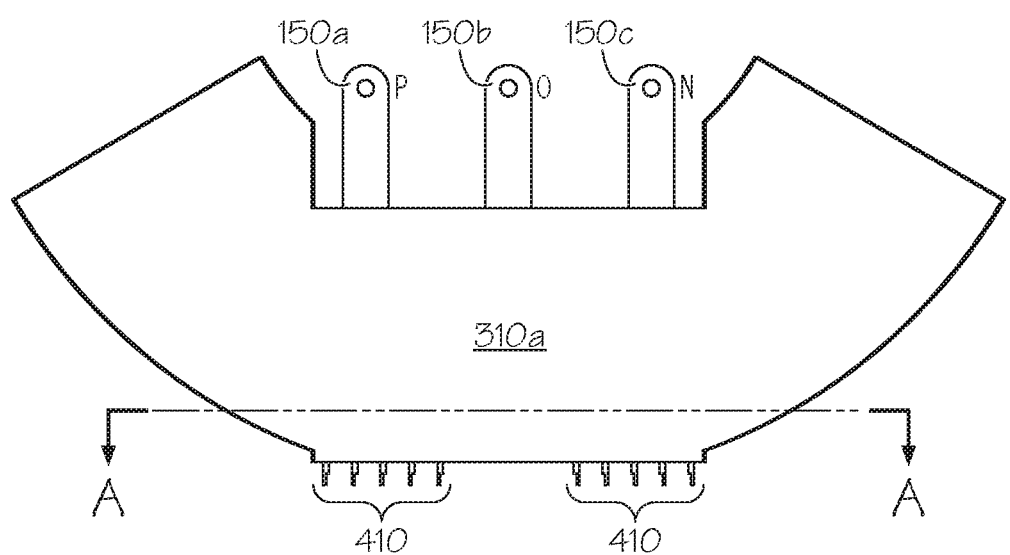
FIG. 4 depicts a side view of an individual power card of three power cards forming an individual power plate in the example integrated power control assembly of FIG. 1, according to one or more embodiments shown and described herein.

FIG. 4 depicts a side view of individual power card 310a, which along with power cards 310b and 310c form a circular-disk-shaped individual power plate 310 in the example integrated power control assembly 110. The power card 310a is electrically connected to the individual circuit board 140 and produces U-phase AC output for the motor 101. The power card 310a has three busbars 150a, 150b, and 150c. The busbar 150a is configured to electrically connect the individual power card 310a to the positive terminal 910 of the battery 900 (shown in FIG. 9) via a connection P. The busbar 150c is configured to electrically connect the individual power card 310a to the negative terminal 920 of the battery 900 (shown in FIG. 9) via a connection N. The busbar 150b is configured to electrically connect a U-Phase AC output of the individual power card 310a to the motor 101 via a connection O. The example power card 310a further includes drive-and-sense pins 410 for electrically connecting the circuit board 140. The drive-and-sense pins 410 may be electrically connected to the three busbars 150a, 150b, and 150c via wire bonding. The other power cards 310b. 310c, 320a. 320b. 320c, 330a. 330b, and 330c are substantially similar to the individual power card 310a and have the same or substantially same mechanical and electrical features.

Figure 5:
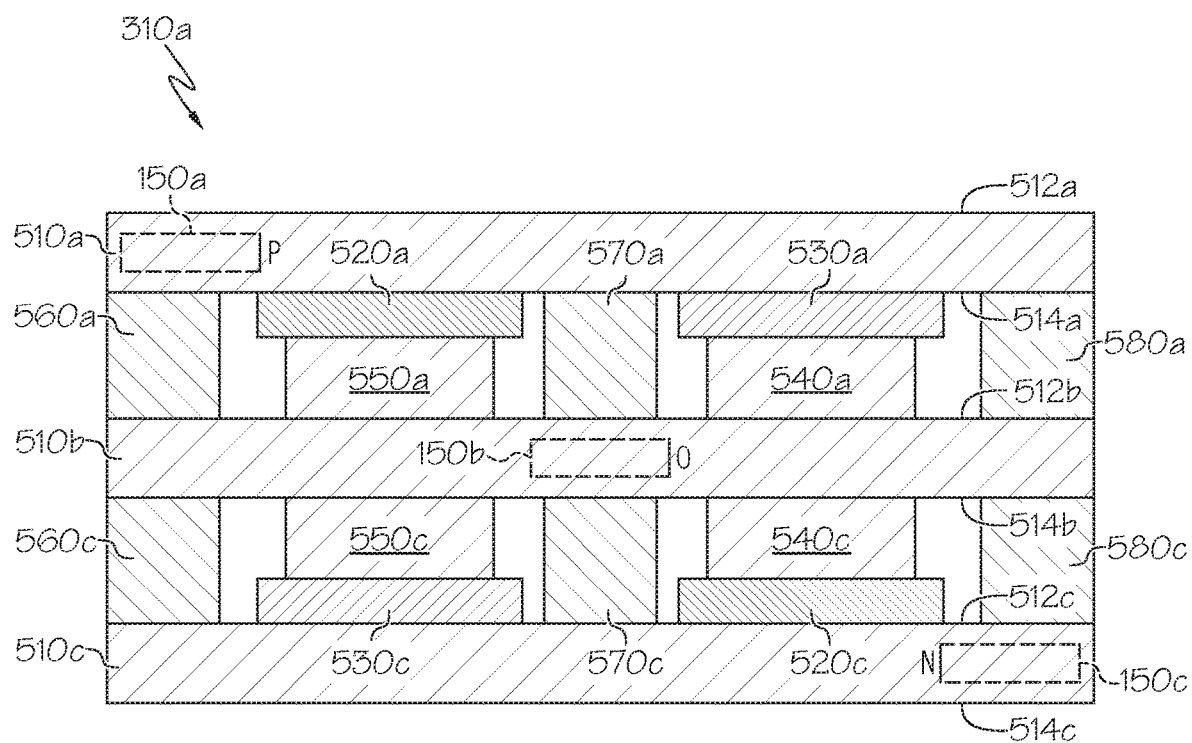
FIG. 5 depicts a side cross-sectional view of an individual power card along a sectional axis A-A in the example integrated power control assembly of FIG. 1, according to one or more embodiments shown and described herein.

FIG. 5 depicts a side cross-sectional view of the individual power card 310a along a sectional axis A-A in the example integrated power control assembly 110. The individual power card 310a includes three electrically-conductive layers 510a, 510b, 510c that are stacked vertically and separated by electrically-insulating blocks 560a, 570a, 580a, 560c, 570c, 580c. The electrically-conductive layers 510a, 510b, 510c may be made from a metal such as, but not limited to, copper, nickel, aluminum, and the like. The electrically-insulating blocks 560a. 570a, 580a, 560c, 570c, 580c may be made from a non-electrically conductive material, such as ceramic or polymer material.

The electrically-conductive layers 510a, 510b, 510c may be disposed at the top, middle and bottom of the power card 310a respectively. The electrically-conductive layer 510a has a top surface 512a and a bottom surface 514a. A diode 520a and a switching semiconductor device 530a may be bonded (for example by solder) to the bottom surface 514a. The diode 520a may be separated from the switching semiconductor device 530a by the electrically-insulating block 570a. A first conductive spacer 550a may be disposed between the diode 520a and a top surface 512b of the electrically-conductive layer 510b, while a second conductive spacer 540a may be disposed between the switching semiconductor device 530a and the top surface 512b of the electrically-conductive layer 510b. The first conductive spacer 550a and the second conductive spacer 540a may be bonded to the top surface 512b of the electrically-conductive layer 510b and used to match the difference in thickness between the diode 520a and the switching semiconductor device 530a. The first conductive spacer 550a and the second conductive spacer 540a may also be bonded to the diode 520a and the switching semiconductor device 530a respectively.

The electrically-conductive layer 510c has top surface 512c and a bottom surface 514c. A diode 520c, substantially similar to the diode 520a and a switching semiconductor device 530c, substantially similar to the switching semiconductor device 530a may be bonded (for example by solder) to the top surface 512c. The diode 520c may be separated from the switching semiconductor device 530c by the electrically-insulating block 570c. The diode 520c may be vertically aligned with the switching semiconductor device 530a, while the switching semiconductor device 530c may be vertically aligned with the diode 520a. A third conductive spacer 540c may be disposed between the diode 520c and a bottom surface 514b of the electrically-conductive layer 510b, while a fourth conductive spacer 550c may be disposed between the switching semiconductor device 530c and the bottom surface 514b of the electrically-conductive layer 510b. The third conductive spacer 540c and the fourth conductive spacer 550c may be soldered to the bottom surface 514b of the electrically-conductive layer 510b and used to match the difference in thickness between the diode 520c and the switching semiconductor device 530c. The third conductive spacer 540c and the fourth conductive spacer 550c may also be bonded to the diode 520c and the switching semiconductor device 530c respectively.

The switching semiconductor devices 530a, 530c may be one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the switching semiconductor devices 530a, 530c may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, switching semiconductor devices 530a, 530c operate at high current and under high temperatures, for example in excess of 250° C. and generate a large amount of heat that must be removed for the continued operation of the example integrated power control assembly 110.

The switching semiconductor devices 530a. 530c are controlled by the gate drive device 147 in the individual circuit board 140 and enable flow of current into the motor 101 through the busbar 150b, when the motor 101 is turned on. The diodes 520a, 520c enable the flow of current back into the battery 900 through the busbars 150a, 150c respectively, when the motor 101 is turned off.

The electrically-insulating blocks 560a, 570a, 580a may be disposed between the electrically-conductive layers 510a and 510b, while the electrically-insulating blocks 560c. 570c, 580c may be disposed between the electrically-conductive layers 510b and 510c. The electrically-insulating blocks 560a. 570a, 580a provide electrical insulation, mechanical support, and act as efficient thermal bridges towards the cooling plates 130 disposed over the individual power card 310a due to their large surface area, relatively small thickness and high thermal conductivity. It should be noted that the individual power card 310a depicted in FIG. 5 is only an example and in different embodiments, may incorporate additional or alternate configurations that are compatible with the features and operating principles of the integrated power control assembly described herein.

The busbars 150a, 150b, 150c are formed on the electrically-conductive layers 510a, 510b, 510c respectively as shown in FIG. 5 such that the electrically-conductive layer 510a is electrically connected to the connection P to the positive terminal 910 of the battery 900, the electrically-conductive layer 510b is electrically connected to the connection O to the U-Phase AC output, and the electrically-conductive layer 510c is electrically connected to the connection N to the negative terminal 920 of the battery 900. The large surface area of the electrically-conductive layers 510a, 510b, 510c make them efficient for spreading the heat generated during operation of the power card 310a, thereby improving its thermal performance. The individual circuit card shown in FIGS. 4-5 is depicted only as an example and in different embodiments, may incorporate additional or alternate configurations that are compatible with the features and operating principles of the integrated power control assembly described herein.

Figure 6:
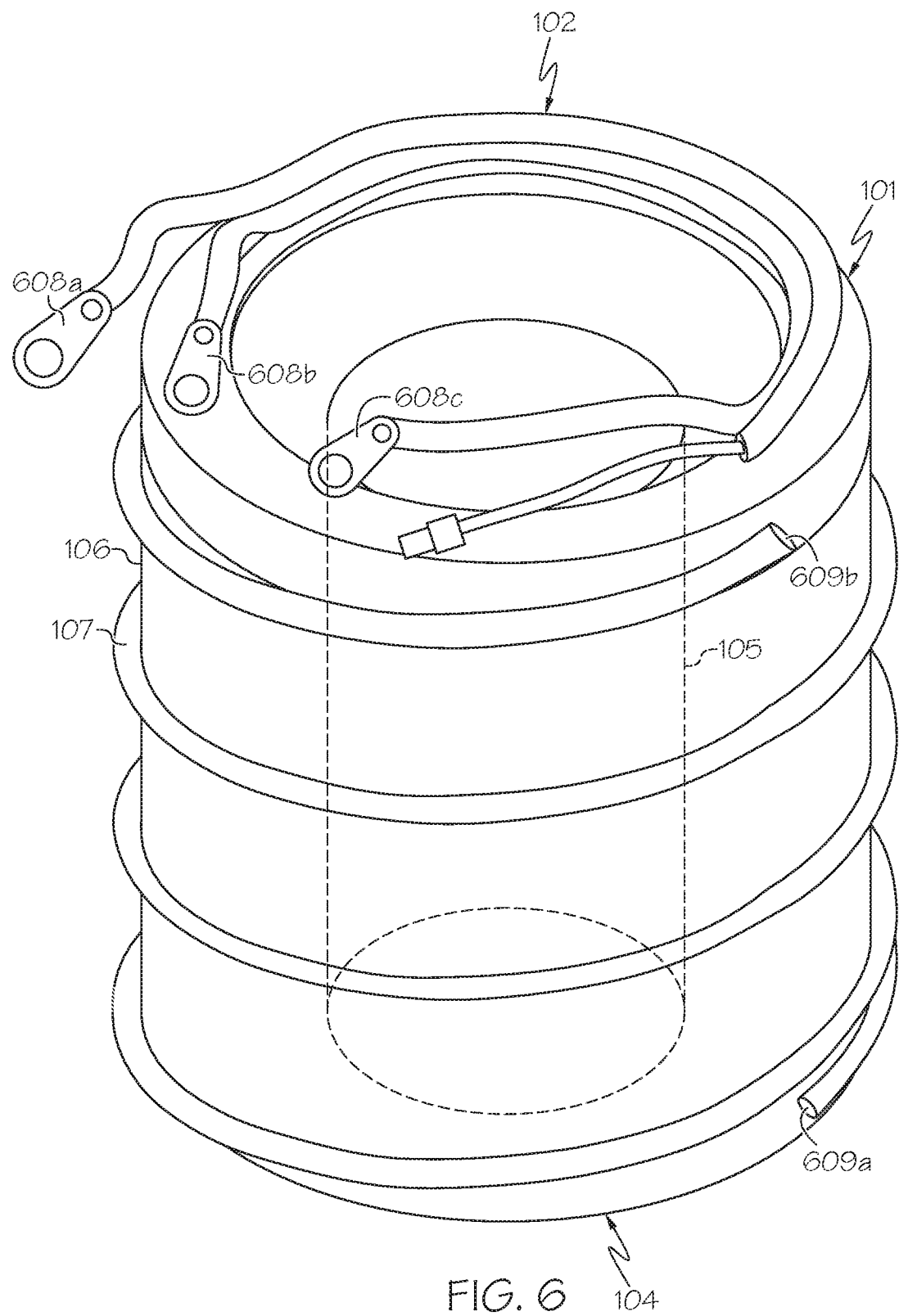
FIG. 6 depicts a perspective view of a cooling jacket configured to encase the example motor of FIG. 1, according to one or more embodiments shown and described herein.

FIG. 6 depicts a perspective view of an example cooling jacket 106 configured to encase the motor 101. The example cooling jacket 106 may be formed from any suitable material such as, but not limited to, copper, aluminum, or nickel. The cooling jacket 106 is concentric with and encases the motor shaft 105 of the motor 101. The cooling jacket 106 has a cooling pipe 107 spiraling externally between the first axial end 102 and the second axial end 104 of the motor 101. The cooling pipe 107 has a fluid inlet 609a proximate to the first axial end 102 and a fluid outlet 609b proximate to the second axial end 104. The cooling jacket 106 houses conductive wires 608a, 608b, 608c that are configured to electrically connect (for example, by solder) to U-phase AC output from the busbar 150b, V-phase AC output from the busbar 170b, W-phase AC output from the busbar 190b respectively.

A cooling fluid flows through the cooling pipe 107, directed by a pump (not shown) around the circumference of the motor 101 between the fluid inlet 609a and the fluid outlet 609b. The cooling fluid is configured to absorb and transfer heat generated from the operation of the motor 101 and the integrated power control assembly 110. The cooling fluid may be air, water, ethylene glycol mixture, a single-phase coolant, a two-phase coolant, a dielectric coolant, or an electrically insulating coolant.

Figure 7:
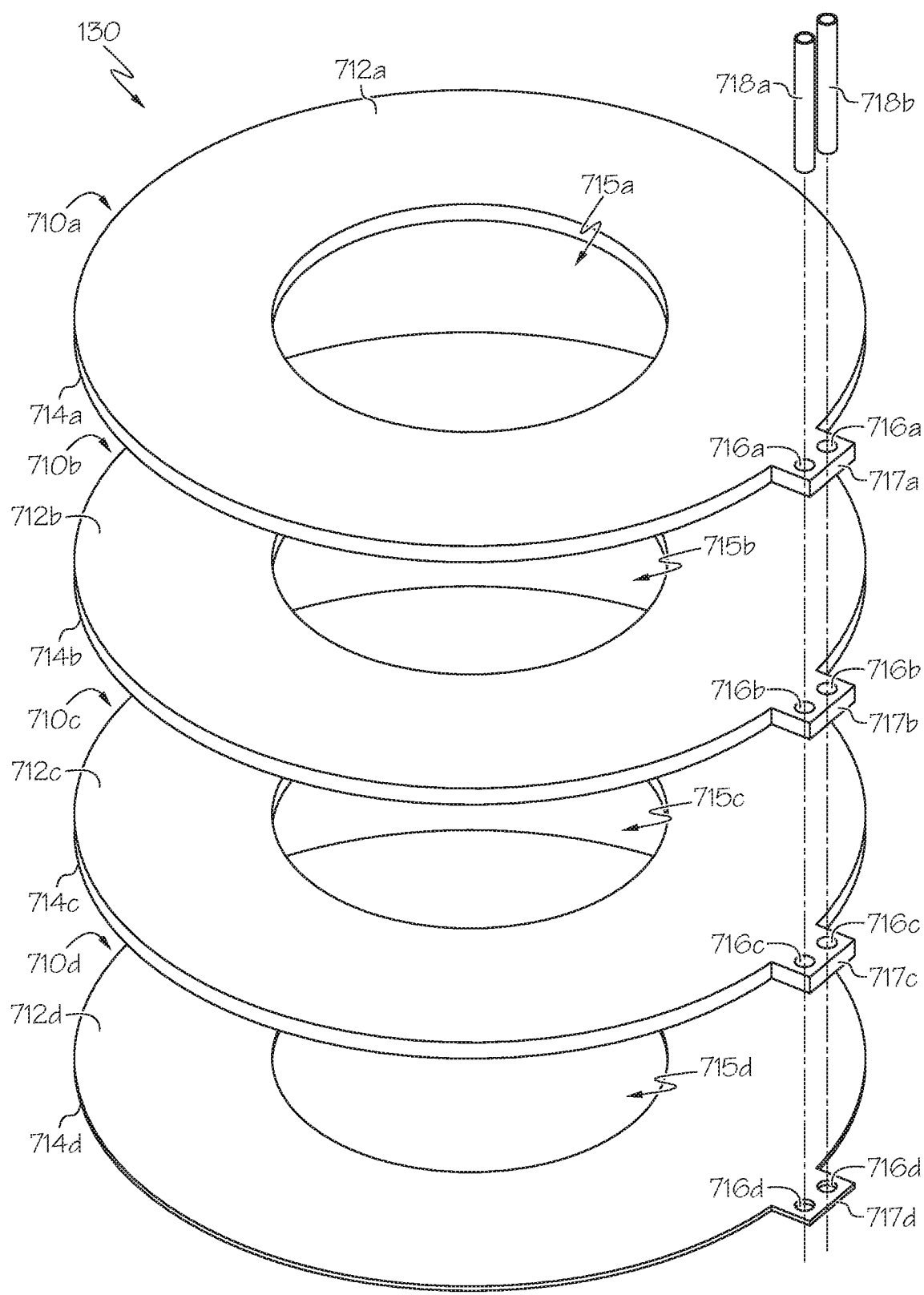
FIG. 7 depicts an exploded perspective view of cooling plates in the example integrated power control assembly of FIG. 1, according to one or more embodiments shown and described herein.
Figure 8:
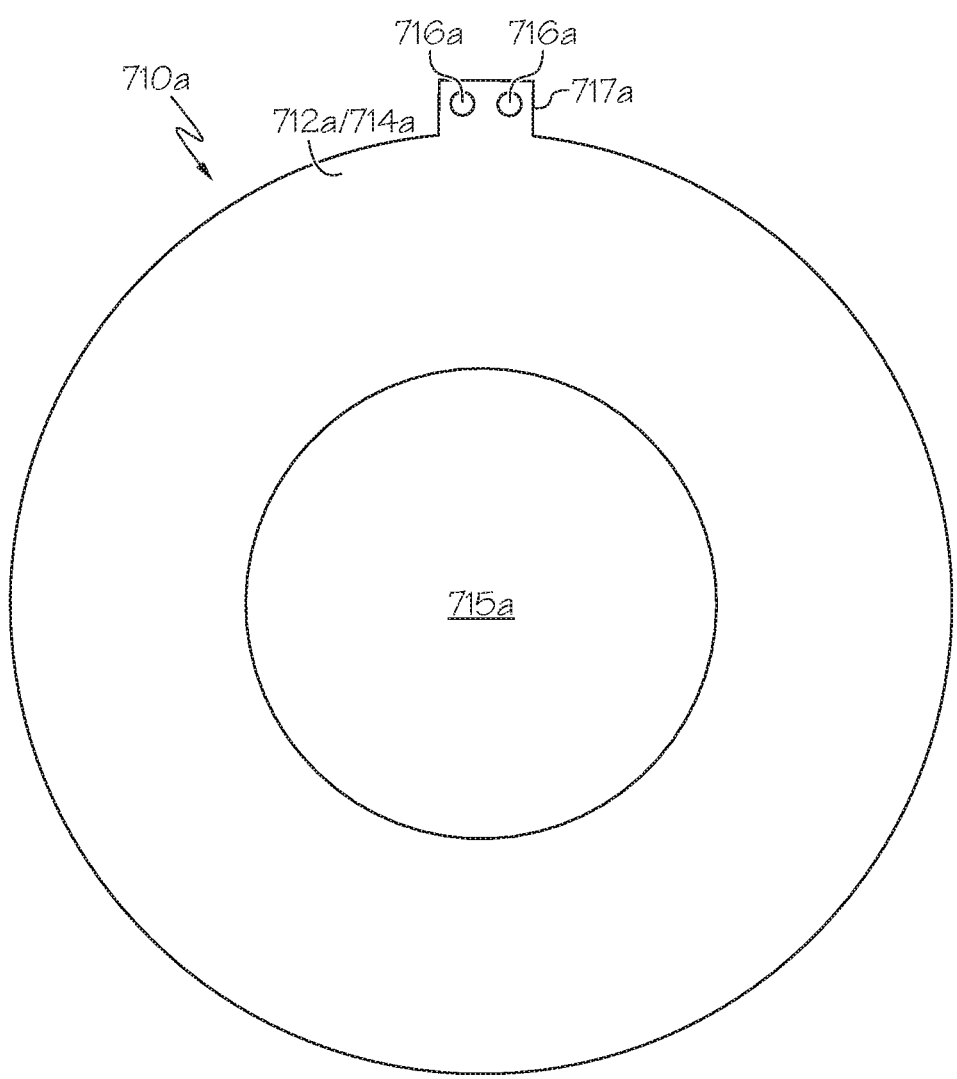
FIG. 8 depicts a side view of an individual cooling plate in the example integrated power control assembly of FIG. 1, according to one or more embodiments shown and described herein.

FIG. 7 depicts an exploded perspective view of cooling plates 130 in the example integrated power control assembly 110, while FIG. 8 depicts a side view of an individual cooling plate 130. FIG. 7 depicts four cooling plates 710a, 710b, 710c, 710d that are configured to have individual power plates 120 disposed between them. The cooling plates 710a, 710b, 710c, 710d have a top surface 712a, 712b, 712c, 712d respectively, a bottom surface 714a, 714b, 714c, 714d respectively and an aperture 715a, 715b, 715c, 715d respectively between the top surface 712a, 712b, 712c, 712d and the bottom surface 714a, 714b, 714c, 714d. The cooling plates 710a, 710b, 710c, 710d further have extended edges 717a, 717b, 717c, 717d respectively. The extended edges 717a, 717b, 717c, 717d have holes 716a, 716b, 716c, 716d through which a common inlet duct 718a and a common outlet duct 718b pass. The common inlet duct 718a may be configured to be fluidly connected to the fluid inlet 609a and the common outlet duct 718b may be configured to be fluidly connected to the fluid outlet 609b. The cooling plates 130 shown in FIGS. 7-8 are depicted only as examples and in different embodiments, may incorporate additional or alternate configurations that are compatible with the features and operating principles of the integrated power control assembly described herein.

FIG. 9 schematically depicts an arrangement of electrical connections of the example integrated power control assembly 110 with the battery 900 and the motor 101 having AC-input in three phases U, V. W. In operation, the individual power cards 310a, 320a, 330a receive DC current through the connections P1 and N1 to the positive terminal 910 and the negative terminal 920 respectively of the battery 900. The individual power cards 310a, 320a, 330a provide AC output through the connection O1 to a U-phase AC input 930 of the motor 101. As explained above, the individual power cards 310a. 320a, 330a are part of different power plates 310, 320, 330 respectively but aligned to share the individual circuit board 140.

Similarly, the individual power cards 310b, 320b, 330b receive DC current through the connections P2 and N2 to the positive terminal 910 and the negative terminal 920 respectively of the battery 900. The individual power cards 310b, 320b, 330b provide AC output through the connection O2 to a V-phase AC input 940 of the motor 101. As explained above, the individual power cards 310b, 320b, 330b are part of the different power plates 310, 320, 330 respectively but aligned to share the individual circuit board 160. In a similar fashion, the individual power cards 310c, 320c, 330c receive DC current through the connections P3 and N3 to the positive terminal 910 and the negative terminal 920 respectively of the battery 900. The individual power cards 310c, 320c, 330c provide AC output through the connection O3 to a W-phase AC input 950 of the motor 101. As explained above, the individual power cards 310c, 320c. 330c are part of the different power plates 310, 320, 330 respectively but aligned to share the individual circuit board 180.

Figure 10:
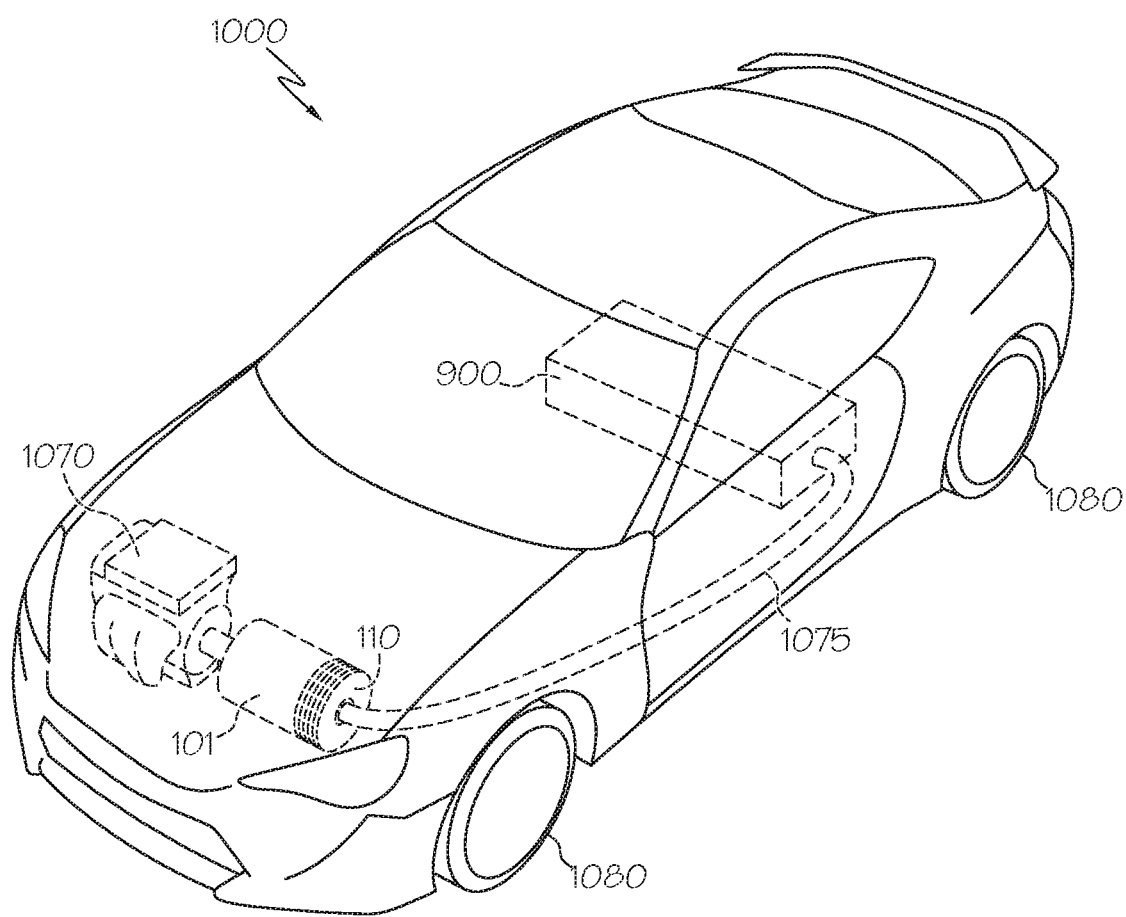
FIG. 10 schematically depicts an example electric vehicle having the example motor and the example integrated power control assembly of FIG. 1, according to one or more embodiments shown and described herein.

As stated above, the integrated power control assemblies 110 described herein may be incorporated into the motor assembly 100 of a vehicle 1000. The vehicle 1000 may be a hybrid vehicle, a plug-in electric hybrid vehicle, an electric vehicle, or any vehicle that utilizes an electric motor. FIG. 10 schematically depicts the vehicle 1000 having the motor 101 electrically coupled to the example integrated power control assembly 110. The vehicle 1000 generally comprises a gasoline engine 1070 and the motor 101 described above, both of which are configured to provide rotational movement to the wheels 1080 of the vehicle 1000 to propel the vehicle 1000 down the road. The example integrated power control assembly 110 is mounted on an axial end of the motor 101 and configured as an inverter for the motor 101. The example integrated power control assembly 110 is in turn electrically coupled to the battery 900 as noted above by electrical connections 1075.

The integrated power control assemblies described herein can be advantageously configured to function as an inverter for an electric motor. Due to the modular nature, the integrated power control assemblies can be configured to meet any current/power rating requirements. The modular nature also makes the manufacturability and assembly processes easier. The use of busbars shortens electrical connections and eliminates interconnecting high voltage cables. The planar wireless bond package connecting the busbars in the individual power cards reduce the loop inductance, reducing the voltage spikes and switching power loss. The use of decoupling capacitors in the individual circuit boards help reduce loop inductance in the individual power cards, as well. Further, due to integration with the cooling plates, the distance between the individual power cards and the motor could be shortened. Overall, the design of the integrated power control assemblies becomes simplified through reduction in weight, volume, and cost of the powertrain used in electric and/or hybrid electric vehicles.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An integrated power control assembly configured as an inverter for a motor and mounted directly on an axial end of the motor, comprising:
   one or more power plates, an individual power plate of the one or more power plates having a power card having one or more switching semiconductor devices corresponding to individual phases of a plurality of phases of the motor, wherein the power card of the one or more power plates is electrically coupled to the motor through one or more busbars;
   one or more cooling plates coaxially disposed on and thermally connected to the one or more power plates; and
   one or more circuit boards disposed on and at least partially covers an outer circumferential edge of the one or more power plates, wherein:

an individual circuit board of the one or more circuit boards is electrically coupled to an individual power card of the one or more power plates corresponding to an individual phase of the plurality of phases of the motor and has a first surface electrically coupled to the one or more power plates and a second surface opposite to the first surface.

2. The integrated power control assembly of claim 1, wherein the one or more power plates and the one or more cooling plates are shaped as a circular disk.

3. The integrated power control assembly of claim 1, wherein the one or more power plates are formed from one or more of the following: copper, aluminum, and nickel.

4. The integrated power control assembly of claim 1, wherein the one or more cooling plates are formed from a dielectric material.

5. The integrated power control assembly of claim 1 further comprising:
one or more gate drive devices disposed on the second surface and operable to control the one or more switching semiconductor devices.

6. The integrated power control assembly of claim 1 further comprising one or more decoupling capacitors disposed on the second surface.

7. The integrated power control assembly of claim 1, wherein the one or more cooling plates further comprise a common inlet duct and a common outlet duct for circulating a cooling fluid.

8. The integrated power control assembly of claim 7, wherein the cooling fluid comprises one or more of the following: air, water, ethylene glycol mixture, a single-phase coolant, a two-phase coolant, a dielectric coolant, and an electrically insulating coolant.

9. The integrated power control assembly of claim 1, wherein the one or more power plates and the one or more cooling plates are disposed alternatively to form a stacked configuration.

10. The integrated power control assembly of claim 1, wherein the individual circuit board is electrically coupled to the one or more power plates through a planar bond layer.

11. A motor assembly comprising:
a motor;
an integrated power control assembly configured as an inverter for the motor and mounted directly on an axial end of the motor, the integrated power control assembly comprising:
one or more power plates, an individual power plate of the one or more power plates having a power card having one or more switching semiconductor devices corresponding to individual phases of a plurality of phases of the motor, wherein the power card of the one or more power plates is electrically coupled to the motor through one or more busbars;
one or more cooling plates coaxially disposed on and thermally connected to the one or more power plates; and
one or more circuit boards disposed on and at least partially covers an outer circumferential edge of the one or more power plates, wherein:
an individual circuit board of the one or more circuit boards is electrically coupled to an individual power card of the one or more power plates corresponding to an individual phase of the plurality of phase of the motor and has a first surface electrically coupled to the one or more power plates and a second surface opposite to the first surface.

12. The motor assembly of claim 11, wherein the one or more power plates and the one or more cooling plates are shaped as a circular disk.

13. The motor assembly of claim 11, wherein the one or more power plates are formed from one or more of the following: copper, aluminum, and nickel.

14. The motor assembly of claim 11, wherein the one or more cooling plates are formed from a dielectric material.

15. The motor assembly of claim 11 further comprising:
one or more gate drive devices disposed on the second surface and operable to control the one or more switching semiconductor devices.

16. The motor assembly of claim 11 further comprising one or more decoupling capacitors disposed on the second surface.

17. The motor assembly of claim 11, wherein the one or more cooling plates further comprise a common inlet duct and a common outlet duct for circulating a cooling fluid.

18. The motor assembly of claim 17, wherein the cooling fluid comprises one or more of the following: air, water, ethylene glycol mixture, a single-phase coolant, a two-phase coolant, a dielectric coolant, and an electrically insulating coolant.

19. The motor assembly of claim 11, wherein the one or more power plates and the one or more cooling plates are disposed alternatively to form a stacked configuration.

20. The motor assembly of claim 11, wherein the individual circuit board is electrically coupled to the one or more power plates through a planar bond layer.

* * * * *